United States Patent
Tsubouchi et al.

(10) Patent No.: US 6,495,461 B2
(45) Date of Patent: Dec. 17, 2002

(54) PROCESS FOR FORMING AMORPHOUS TITANIUM SILICON NITRIDE ON SUBSTRATE

(75) Inventors: Kazuo Tsubouchi, Sendai (JP); Kazuya Masu, Sendai (JP); Hideki Matsuhashi, Sendai (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/955,039

(22) Filed: Sep. 19, 2001

(65) Prior Publication Data

US 2002/0017658 A1 Feb. 14, 2002

Related U.S. Application Data

(62) Division of application No. 09/149,281, filed on Sep. 9, 1998.

(30) Foreign Application Priority Data

Sep. 12, 1997 (JP) .............................. 9-249226
Oct. 28, 1997 (JP) .............................. 9-295691

(51) Int. Cl.$^7$ ............................................ H01L 21/44
(52) U.S. Cl. .................................................... 438/683
(58) Field of Search ........................ 438/643, 648–651, 438/653, 655, 656, 688, 683, 365

(56) References Cited

U.S. PATENT DOCUMENTS

| | | | | |
|---|---|---|---|---|
| 4,855,798 A | * | 8/1989 | Imamura et al. ................. 23/48 |
| 5,091,210 A | | 2/1992 | Mikoshiba et al. ............. 427/39 |
| 5,179,042 A | | 1/1993 | Mikoshiba et al. ........... 437/187 |
| 5,180,687 A | | 1/1993 | Mikoshiba et al. ........... 437/187 |
| 5,196,372 A | | 3/1993 | Mikoshiba et al. ........... 437/187 |
| 5,659,057 A | * | 8/1997 | Vaartstra ........................ 556/51 |
| 5,770,520 A | | 6/1998 | Zhao et al. .................... 438/653 |
| 5,903,053 A | * | 5/1999 | Iijima et al. ................... 257/751 |
| 5,998,871 A | | 12/1999 | Urabe ............................ 257/754 |
| 6,008,124 A | | 12/1999 | Sekiguchi et al. ............ 438/653 |
| 6,069,093 A | * | 5/2000 | Tada et al. .................... 438/761 |

FOREIGN PATENT DOCUMENTS

| | | |
|---|---|---|
| JP | 3-11571 | 1/1991 |
| JP | 8-274173 | 10/1996 |
| JP | 8-316233 | 11/1996 |

OTHER PUBLICATIONS

M. Sekiguchi, et al., "Formation of Barrier Metal Layer on $TiSi_2$ Surface by $N_2$ Plasma Treatment", Jpn. Soc. Appl. Phys. and Related Soc., Ext. Abs. of $43^{rd}$ Spring Mtg., p. 673, No. 26p–Q–4 (1996) with translation.

* cited by examiner

Primary Examiner—David Nelms
Assistant Examiner—Quoc Hoang
(74) Attorney, Agent, or Firm—Fitzpatrick, Cella, Harper & Scinto

(57) ABSTRACT

A semiconductor device comprising a substrate, a conductor and an insulating film provided on the surface of the substrate, part of the surface of the substrate being electrically connected with the conductor through a contact hole made in the insulating film, wherein a barrier layer present between part of the surface of the substrate and the conductor is provided only on the bottom of the contact hole, and the barrier layer provided on the bottom comprises amorphous titanium silicon nitride.

This can provide a structure that has a barrier layer with a low contact resistance, enables formation of a conductor film of good quality on the barrier layer, and can attain a good electrical conduction even at fine contact holes.

10 Claims, 9 Drawing Sheets

PROCESS FOR FORMING AMORPHOUS TITANIUM SILICON NITRIDE ON SUBSTRATE

This is a division of application Ser. No. 09/149,281 filed Sep. 9, 1998.

BACKGROUND OF THE INVENTION

1. Field of the Invention

This invention relates to a semiconductor integrated-circuit device used in microprocessors, DRAMs (dynamic random access memories), theoretical circuits and so forth, and more particularly to a semiconductor device characteristic of structure at its contact holes. It also relates to a process for forming amorphous titanium silicon nitride on a substrate.

2. Related Background Art

FIG. 11 is a schematic cross-sectional view at the part of a contact hole of a conventional semiconductor integrated-circuit device.

On the surface of a substrate 1 such as a silicon wafer, an insulating film 2 is formed where the contact hole has been formed. A barrier layer 4 is formed on the surface of the insulating film 2 inclusive of that on the sidewall of the contact hole and on the substrate surface to which the bottom of the contact hole is laid bare. A conductive layer 8 such as an Al—Cu or Al—Si—Cu layer is formed on the barrier layer 4.

The aluminum (Al) which is an element constituting the conductive layer 8 that functions as an electrode or wiring tends to react with the silicon (Si) which is an element constituting the substrate. Hence, in order to prevent such reaction, the barrier layer 4 is provided between the substrate and the conductive layer. Titanium nitride (TiN) is used in the barrier layer.

FIG. 12 shows an example of a contact hole disclosed in Japanese Patent Application Laid-Open No. 8-274173.

In this example, two layers, a titanium (Ti) layer 3 and a TiN barrier layer 4, are formed on the insulating film 2 and the sidewall and bottom of the contact hole, and a W (tungsten) wiring 9 is formed in the contact hole. A TiN layer 5, a Ti layer 6 and TiN layer 7 are further provided as a triple diffusion barrier for preventing the wiring 8 formed of Al—Cu or the like from reacting with the tungsten wiring 9.

FIG. 13 shows a structure disclosed in Japanese Patent Application Laid-Open No. 8-316233. This structure is basically the same as the prior art shown in FIG. 11, except that an insulating film 10 of silicon nitride (SiN) is formed on the surface of the substrate 1 and an insulating film 2 having contact holes is formed thereon.

In all the prior art described above, the barrier layer 4 is so provided as to cover the whole substrate surface, i.e., the surface of insulating film 2 and the sidewall and bottom of each contact hole.

Then the barrier layer has a thickness of from 30 nm to 50 nm. Hence, if the contact hole has a side length smaller than 0.25 $\mu$m, the inside of the contact hole may come to be substantially filled up with the barrier layer 4, resulting in a high contact resistance. For example, a barrier layer of 50 nm thickness is formed in a contact hole of 0.18 $\mu$m in side length, the inside of the contact hole is half or more held by the barrier layer.

Accordingly, it is desired to form the barrier layer comprised of TiN, only on the bottom of the contact hole, i.e., only on the surface of the substrate 1 which is laid bare at the contact hole. However, any growth process for such selective formation is unknown.

Under such circumstances, a method is available in which, using titanium silicon nitride (TiSiN) in place of TiN, a barrier layer comprised of TiSiN is formed only on the bottom of the contact hole.

FIG. 14 shows how it stands.

A titanium silicide ($TiSi_2$) film 11 is formed on the surface of a substrate 1, and an insulating film 2 having a contact hole is formed on the titanium silicide film 11. Then a titanium silicon nitride (TiSiN) 12 is formed only on the bottom of the contact hole. No titanium silicon nitride is present on the sidewall of the contact hole.

This structure can be set up by forming the $TiSi_2$ film on the substrate comprised of silicon (Si), forming the insulating film thereon, making the contact hole, and then nitriding the Ti uncovered surface, laid bare to the bottom of the contact hole (H. Shinriki et al., Extended Abstracts on SSDM (1994), p.946).

However, this method has a possibility of causing impurities to be sucked up into $TiSi_2$ as a result of high-temperature heat treatment.

Meanwhile, as a method different from the above selective film formation on the contact hole bottom surface, Extended Abstracts of The 43rd Spring Meeting (1996), The Japan Society of Applied Physics and Related Societies, page 673, 26p-Q-4, discloses a method in which a TiSiN film is formed over the whole substrate surface at a low temperature. In this method, the $TiSi_2$ film is formed on the silicon substrate in a thickness of 70 nm, and the back thereof is exposed to nitrogen ($N_2$) plasma. It is done at an $N_2$ pressure of 80 mTorr and an applied power of 300 W.

However, the TiSiN film thus obtained by $N_2$ plasma processing at a pressure of 80 mTorr and a temperature of 50° C. is, as will be detailed later, a coarse crystalline film in which titania ($TiO_2$) is much produced, and can not be made into a uniform continuous film if it is formed in a thin film of about 10 nm. Moreover, it has been found that this coarse crystalline TiSiN film may cause a low film quality for the conductor film to be deposited thereon. Hence, the TiSiN film formed by this method is not suitable for its working according to the design criterion of a minimum working size of less than 0.25 $\mu$m.

SUMMARY OF THE INVENTION

An object of the present invention is to provide a structure having a barrier layer with a low contact resistance.

Another object of the present invention is to provide a structure that can attain a good electrical conduction even at fine contact holes of smaller than 0.25 $\mu$m in side length.

Still another object of the present invention is to provide a structure having a barrier layer that enables formation of a conductor film of good quality on the barrier layer.

A further object of the present invention is to provide a process for forming by CVD (chemical vapor deposition) a titanium silicon nitride film that can form a good barrier layer.

The semiconductor device according to the present invention is a semiconductor device comprising a substrate, a conductor and an insulating film provided on the surface of the substrate, part of the surface of the substrate being electrically connected with the conductor through a contact hole made in the insulating film, wherein;

a barrier layer present between part of the surface of the substrate and the conductor is provided only on the bottom of the contact hole; and the barrier layer provided on the bottom comprises amorphous titanium silicon nitride.

The process for forming amorphous titanium silicon nitride according to the present invention is a process for forming amorphous titanium silicon nitride on the surface of a substrate, comprising the steps of:

a) forming titanium silicide on the surface of the substrate; and b) exposing the titanium silicide formed on the surface of the substrate, to nitrogen plasma while maintaining the temperature of the substrate within the range of from 200° C. to 450° C. and keeping the inside of a reaction chamber at a pressure of 13.3 Pa or above, to form the amorphous titanium silicon nitride.

The process for forming amorphous titanium silicon nitride according to the present invention is also a process for forming amorphous titanium silicon nitride on the surface of a substrate provided in a reaction chamber, comprising the step of introducing a tetradiethylaminotitanium gas and an $Si_2H_6$ gas into the reaction chamber while maintaining the substrate temperature within the range of from 200° C. to 450° C. and keeping the inside of the reaction chamber at a pressure of from 13.3 Pa to 267 Pa, to form the amorphous titanium silicon nitride on the substrate.

DESCRIPTION OF THE PREFERRED EMBODIMENTS

Figure 1:
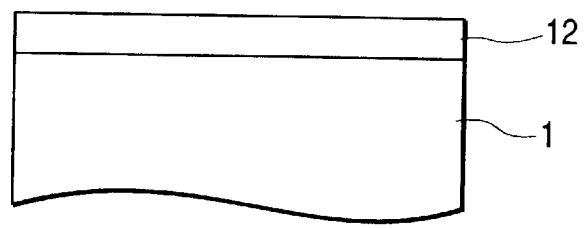
FIG. 1 cross-sectionally illustrates an amorphous titanium silicon nitride ($\alpha$-TiSiN) film formed on the substrate surface according to the present invention.

The semiconductor device of the present invention has a structure wherein part of the surface of a substrate is electrically connected with a conductor through a contact hole made in an insulating film provided on the surface of the substrate, and is characterized in that a barrier layer present between part of the substrate surface and the conductor is provided only on the bottom of the contact hole and the barrier layer provided on the bottom is formed of amorphous titanium silicon nitride.

The substrate herein referred to is not limited to the silicon wafer itself, and may also include those in which a semiconductor layer or a metal film has already been formed on the wafer.

The amorphous titanium silicon nitride ($\alpha$-TiSiN) can be made into a continuous thin film of good quality even when formed in a small thickness of 10 nm or less, and also can have a sufficiently low resistivity in its thickness direction.

In addition, when other conductor is deposited on the $\alpha$-TiSiN film, the conductor can be a film of good quality because titania may hardly be produced.

Here, a titanium silicide layer may preferably be provided between the substrate surface and the barrier layer.

The conductor may preferably have a conductive plug provided on the barrier layer and present in the contact hole and a conductive layer present on the conductive plug and on the insulating film, and a layer of a material different from both the materials for the conductive plug and conductive layer may preferably be provided between the conductive plug and the conductive layer.

Part of the substrate surface corresponds to part of the surface of a source or drain region of a transistor, and a titanium silicide layer may be provided on the whole surface of the source or drain region.

The contact hole may preferably have a diameter (or side length) smaller than 0.25 pm.

The conductive plug may preferably be made of an Al metal, a W metal or a Cu metal, and may preferably come in contact with the sidewall of the contact hole (surface formed of the insulating film).

The insulating film may contain nitrogen in its surface portion. Also, the amorphous titanium silicon nitride is in a thickness of 10 nm or less.

A conductor of good quality can be readily formed in the contact hole having a diameter (or side length) smaller than 0.25 pm, by the process for forming amorphous titanium silicon nitride according to the present invention. Thus, a fine structure having a low contact resistance can be provided.

In the process of the present invention, titanium silicide formed on a substrate is exposed to nitrogen plasma while making the inside of a reaction chamber have a high pressure of 13.3 Pa or above, and maintaining the substrate temperature at from 200° C. to 450° C. Because of the former (pressure) condition, any reactive ion etching mode can be restrained. Because of the latter (temperature) condition, the nitriding efficiency can be made higher while preventing impurities from being sucked up into titanium silicide. Thus, the TiSiN film may hardly be crystallized because titania can hardly be formed, and can be made into a amorphous film of good quality.

Here, as a preferred process, the insulating film having a contact hole is formed on the titanium silicide after the titanium silicide has been formed, and the amorphous titanium silicon nitride is formed on the surface of the titanium silicide laid bare at the contact hole.

The process may further comprise the step of selectively depositing in the contact hole a conductor different from the titanium silicon nitride, and such a conductor may be formed by CVD making use of an alkyl aluminum hydride as a material gas.

Before the titanium silicide is exposed to nitrogen plasma, its surface may preferably be cleaned.

The process for forming amorphous titanium silicon nitride according to the present invention may also be a process for forming amorphous titanium silicon nitride on a substrate provided in a reaction chamber, comprising the step of introducing a tetradiethylaminotitanium gas and an $Si_2H_6$ gas into the reaction chamber while maintaining the substrate temperature within the range of from 200° C. to 450° C. and keeping the inside of the reaction chamber at a pressure of from 13.3 Pa to 267 Pa, to form the amorphous titanium silicon nitride on the substrate.

In the above process, the substrate temperature may more preferably be set within the range of from 300° C. to 400° C.

Ammonia gas may also preferably be introduced into the reaction chamber.

A metal film containing aluminum may more preferably be formed after the amorphous titanium silicon nitride has been formed.

Prior to specific description of embodiments of the present invention, an experiment made until the present invention has been accomplished and studies on the results thus obtained will be reported. This will facilitate the understanding of the present invention.

Figure 15:
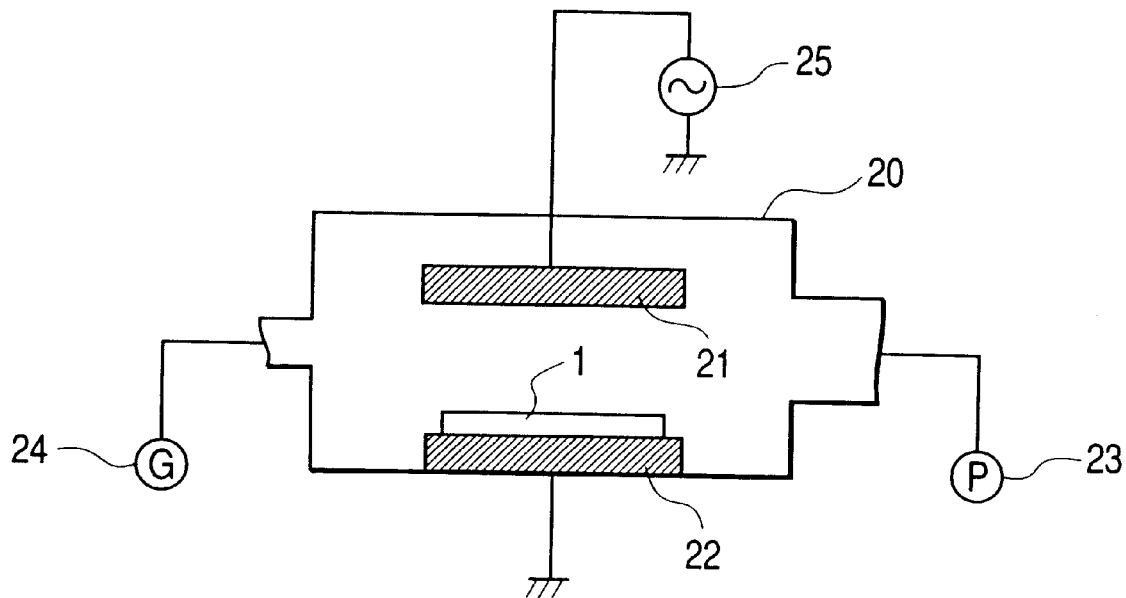
FIG. 15 illustrates a parallel plate type plasma processing system.

FIG. 15 shows a plasma processing system used in the experiment and studies.

As shown in FIG. 15, a parallel plate type plasma processing system is set ready, and a substrate 1 is placed on a holder 22 serving also as an electrode, in a reaction chamber 20 of the system in such a way that the substrate surface to be processed (the side having titanium silicide $TiSi_2$) faces an opposing electrode 21. A vacuum pump 23 is operated to evacuate the inside of the chamber 20, and $N_2$ is fed from a gas feed source 24 as a processing gas. A high-frequency power is applied from a power source 25 while maintaining the chamber internal pressure at 80 mTorr (about 10.7 Pa). Here, the substrate temperature is 50° C.

Figure 16:
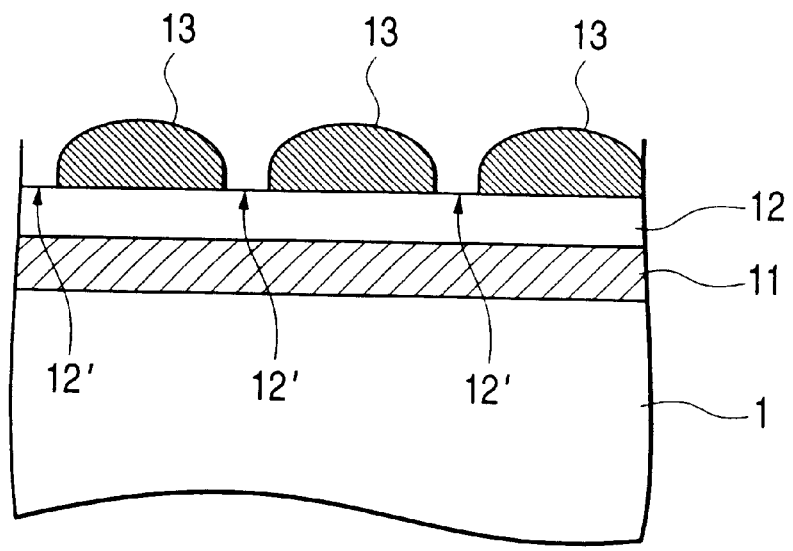
FIG. 16 illustrates the state of aluminum deposited on the titanium silicon nitride formed using the system shown in FIG. 15.

The processing surface of the substrate 1, having the titanium silicide $TiSi_2$, was processed with plasma in this way to obtain TiSiN, and aluminum was tried to be deposited thereon. As a result, the aluminum grew as shown by reference numerals 13's in FIG. 16, and did not become a continuous film of good quality even when it was continued to grow.

The cause was examined to find that, although a film 12 should have been formed of TiSiN, the portions 12' of the film, where the aluminum did not become deposited, appeared to be formed of $TiO_2$. Namely, the film 12 was not formed of a TiSiN of good quality but rather formed of TiSiNO containing oxygen (O) in excess as an impurity.

This is presumed to be due to the conditions for $N_2$ plasma processing, a low pressure and a low temperature, which have brought the plasma into a state of the reactive ion etching mode, so that oxygen ions have been knocked on together with nitrogen ions to form an oxygen-rich, crystalline TiSiNO.

Embodiments of the present invention will be specifically described below first with reference to FIGS. 1 and 2.

FIG. 1 cross-sectionally illustrates a film 12 of amorphous titanium silicon nitride (α-TiSiN) formed on the surface of a substrate 1 according to the present invention. In the α-TiSiN in the present invention, there are no particular limitations on the compositional ratio between Ti, Si and N.

Figure 2:
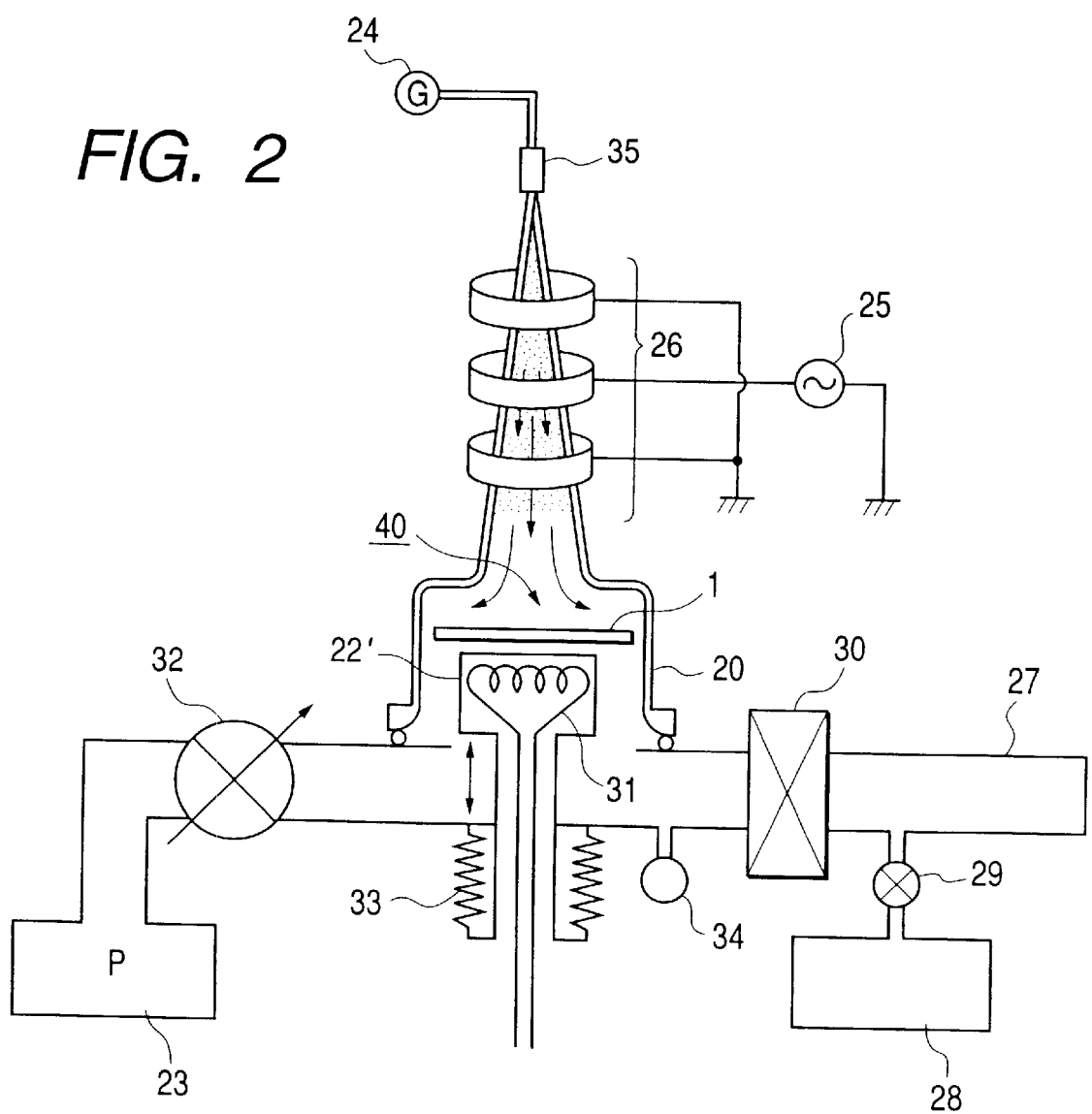
FIG. 2 illustrates an example of a plasma processing system usable in the present invention.

This amorphous titanium silicon nitride can be formed using a plasma processing system shown in FIG. 2.

FIG. 2 illustrates an example of the plasma processing system usable in the present invention, which is obtained by improving a deposition film forming system for forming aluminum films, disclosed in U.S. Pat. No. 5,091,210 and Japanese Patent Application Laid-Open No. 3-11571. In FIG. 2, reference numeral 20 denotes a reaction tube made of quartz; 22', a holder on which the substrate 1 is placed and which is up and down movable by means of an up-and-down mechanism 33. A heating element 31 is provided inside the holder. Reference numeral 23 denotes a vacuum pump for evacuating the inside of the reaction tube 20; 25, a power source; 26, ring type electrodes; and 27, a load lock chamber that can hold substrates before processing and whose inside can be previously evacuated by a vacuum pump 28 and through a valve 29. Reference numeral 30 denotes a gate valve; 32, a variable valve for controlling the degree of vacuum produced by the vacuum pump 23 to adjust the pressure inside the reaction tube; and 34, a pressure sensor. Reference numeral 35 denotes a connector section for switching the gas feed system.

A process of forming the α-TiSiN film 12 on the surface of the substrate 1 will be described below.

The substrate placed inside the load lock chamber 27 is, after the inside of the load lock chamber 27 is evacuated and then the valve 30 is opened, transported into a processing chamber (reaction chamber) 40. The substrate is placed by a transport arm (not shown) on the holder 22' kept moved down, where the holder 22' moves up to set the substrate at the position shown in the drawing. The vacuum pump 23 is driven and the valve 32 is opened to evacuate the inside of the reaction chamber 40. Processing gas is introduced from a gas source 24 and the inside of the reaction chamber is kept at a predetermined pressure. The heating element 31 is electrified to heat the substrate and also an RF power is supplied to the electrodes 26 from the power source 25 to cause $N_2$ plasma to take place.

Figure 4:
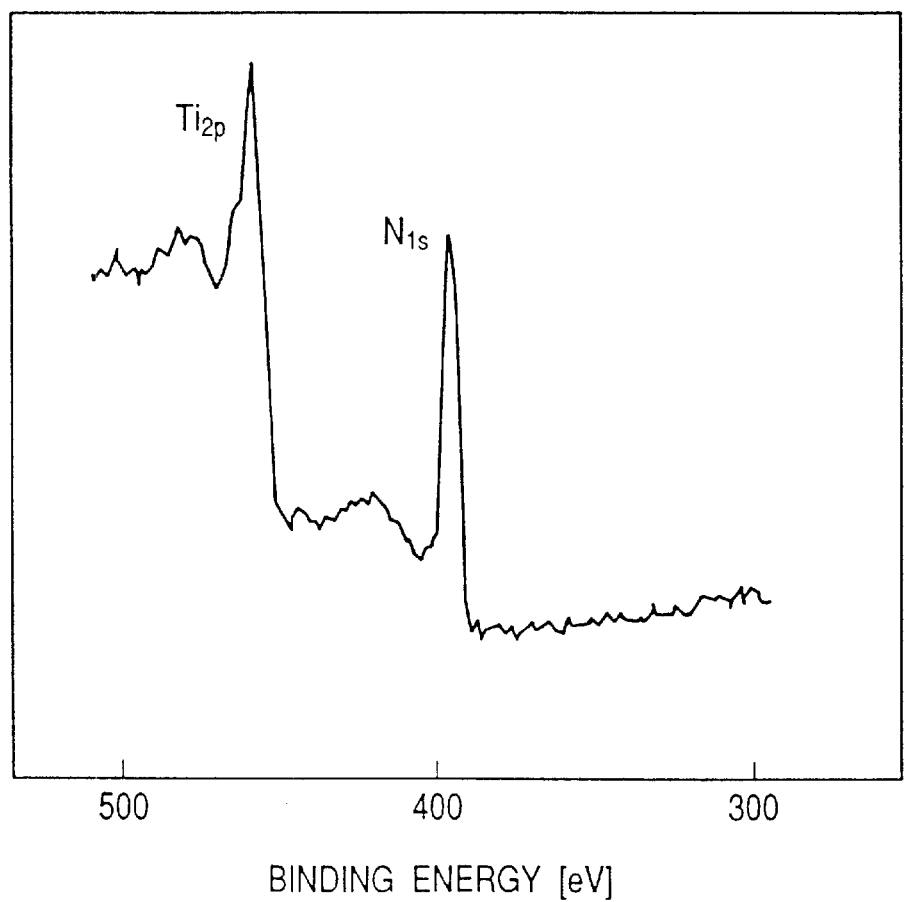
FIG. 4 is a graph showing the results of analysis by ESCA of an $\alpha$-TiSiN film formed according to the present invention.

At this stage, the pressure inside the reaction chamber 40 is set at 13.3 Pa or above, e.g., 26.7 Pa, and the substrate temperature at 200° C. to 450° C., so that the $TiSi_2$ present at the surface of the substrate is nitrided to become α-TiSiN. Analysis by ESCA (electron spectroscopy for chemical analysis) of the α-TiSiN film thus formed has proved that a nitride is formed, because a peak of nitrogen was detectable as shown in FIG. 4.

Figure 5A:
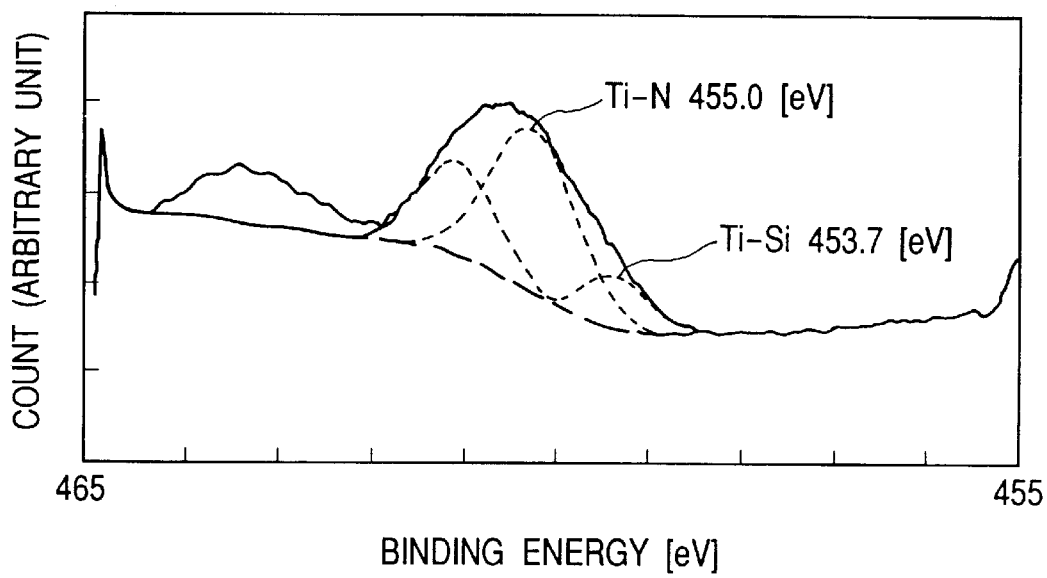
FIGS. 5A and 5B are graphs showing the results of analysis by XPS of the $\alpha$-TiSiN film formed according to the present invention.
Figure 5B:
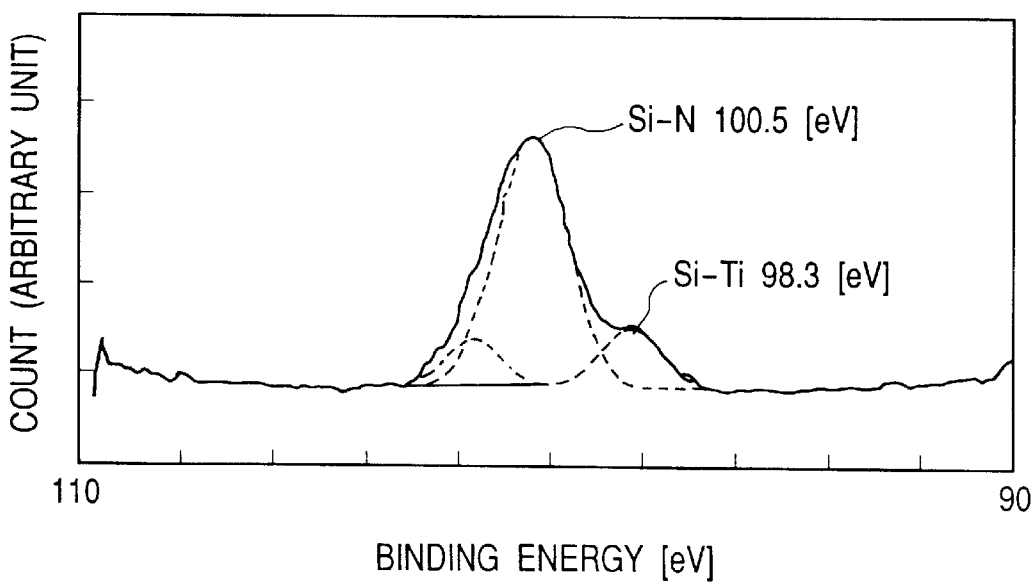

Analysis by XPS (X-ray photoelectron spectroscopy) has also proved that a Ti—Si—N ternary compound of good quality is formed, because a Ti-and-N binding peak and a Ti-and-Si binding peak which is a smaller peak than the former, and an Si-and-N binding peak and a Si-and-Ti binding peak which is a smaller peak than the former, are seen as shown in FIGS. 5A and 5B.

Analysis of this TiSiN film on TEM (transmission electron microscope) and electron ray diffraction patterns has also proved that it is an amorphous film.

This is because, in the $N_2$ plasma processing of the present invention, the pressure is not so excessively low that the processing can be in the mode of plasma doping where the knock-on effect has been restrained, and also the temperature is not so excessively low that the nitriding can be well accelerated, thus the film is restrained from crystallization to become an amorphous film.

Next, on the silicon substrate having thereon the α-TiSiN film thus formed, an aluminum film was formed using dimethylaluminum hydride (DMAH) and hydrogen.

As a film forming system, the same one as that shown in FIG. 2 was used, except that the connector portion 35 of the gas feed system was detached and an aluminum material gas feed system (not shown) was connected. At the time of aluminum film formation, the substrate temperature was set at 180° C., the total pressure inside the reaction chamber at 160 to 400 Pa, and the DMAH partial pressure at $\frac{1}{1,000}$ to $\frac{1}{100}$ of the total pressure.

In this way, aluminum was formed on the α-TiSiN film into a film of about 1.0 μm thick, which was then heated at 400° C. for 30 minutes, and thereafter the aluminum film was peeled to observe the substrate surface. As the result, no etch pits were seen on the substrate surface. Namely, the α-TiSiN film was found to well function as a barrier layer that prevents the reaction of aluminum with silicon.

The process for forming the α-TiSiN film according to the present invention is as described above. In this regard, the aforesaid Japanese Patent Application Laid-Open No. 8-316233 discloses that the TiN film 4 non-selectively formed not only on the bottom of the contact hole but also the sidewall of the contact hole and the surface of the insulating film can be replaced with TiSiN film, but has no description on how to produce it. This is presumably because any amorphous TiSiN film is actually not formed, not to speak of the fact that the publication does not even suggest the formation of an amorphous TiSiN film only on the bottom of the contact hole.

Figure 3:
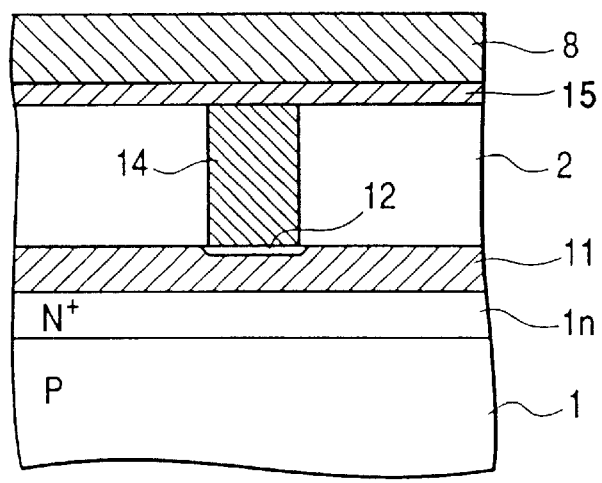
FIG. 3 illustrates an embodiment of the semiconductor device of the present invention.

FIG. 3 illustrates a semiconductor device according to an embodiment of the present invention.

On at least part of the surface of a p-type substrate 1, an $n^+$-type semiconductor layer in is formed, and a TiSi layer 11 is formed thereon. On the TiSi layer 11, an insulating film 2 having a contact hole is provided, and an α-TiSiN layer 12 is formed on the surface of the TiSi layer 11 at the bottom of the contact hole. Here, what is important is that the α-TiSiN layer 12 is formed only on the bottom of the contact hole and is not formed on the sidewall of the contact hole. On the α-TiSiN layer, a conductive metal plug 14 is formed with which the contact hole is filled, and a conductive layer 8 is formed on the surfaces of the metal plug 14 and insulating film 2.

The conductive metal plug 14 may preferably comprise an aluminum metal such as pure Al, Al—Si, Al—Ti, Al—Cu, Al—Si—Ti, Al—Si—Cu or Al—Ti—Cu. It may also comprise tungsten (W) or copper (Cu).

The conductive layer 8 may preferably comprise an aluminum metal such as pure Al, Al—Si, Al—Ti, Al—Cu, Al—Si—Ti, Al—Si—Cu or Al—Ti—Cu. It may also comprise copper (Cu) or gold (Au).

The α-TiSiN layer 12 may a little contain inevitable oxygen.

The TiSi layer 11 may have a thickness of from 5 nm to 100 nm, and preferably from 5 nm to 50 nm.

The α-TiSiN layer may preferably have a thickness equal to or smaller than the thickness of the TiSi layer 11. It may preferably have a thickness of 10 nm or less, and specifically from 1 to 9 nm.

The conductive metal plug 14 may have a thickness, i.e., a height of from about 0.5 μm to about 3 μm and preferably from 0.5 μm to 1.5 μm.

It is also preferable to provide a Ti or TiN layer between the top of the plug 14 and the underside of the conductive layer 8.

The contact hole is an open hole having a side length of, e.g., 0.25 μm, 0.18 μm or 0.13 μm.

According to the structure shown in FIG. 3, the TiSiN layer is made amorphous, and hence it can function as a good barrier layer even when formed in a thickness of as small as 1 nm to 10 nm and can prevent the constituent element(s) of the plug 14 from reacting with the constituent element(s) of the TiSi layer or $n^+$-type layer.

In addition, the quality of the plug 14 is also improved when the under layer (barrier layer) of the plug 14 is the α-TiSiN of the present invention. Thus, the structure that takes charge of electrical interconnection between the conductive layer 8 and the $n^+$-type layer in can be improved in electrical characteristics.

It can also have a low contact resistance because the barrier layer 12 is not present on the sidewall of the contact hole, and the plug 14, grown on the barrier layer 12 and having a low resistance, is provided in contact with the sidewall of the contact hole. Especially in the case of an aluminum metal plug, such a plug has a good close contact with the insulating film and is more preferred.

Thus, a structure at the contact hole portion can be obtained which is low-resistant, though fine.

A preferred fabrication process for forming the α-TiSiN film used in the present invention will be described below.

Figure 6:
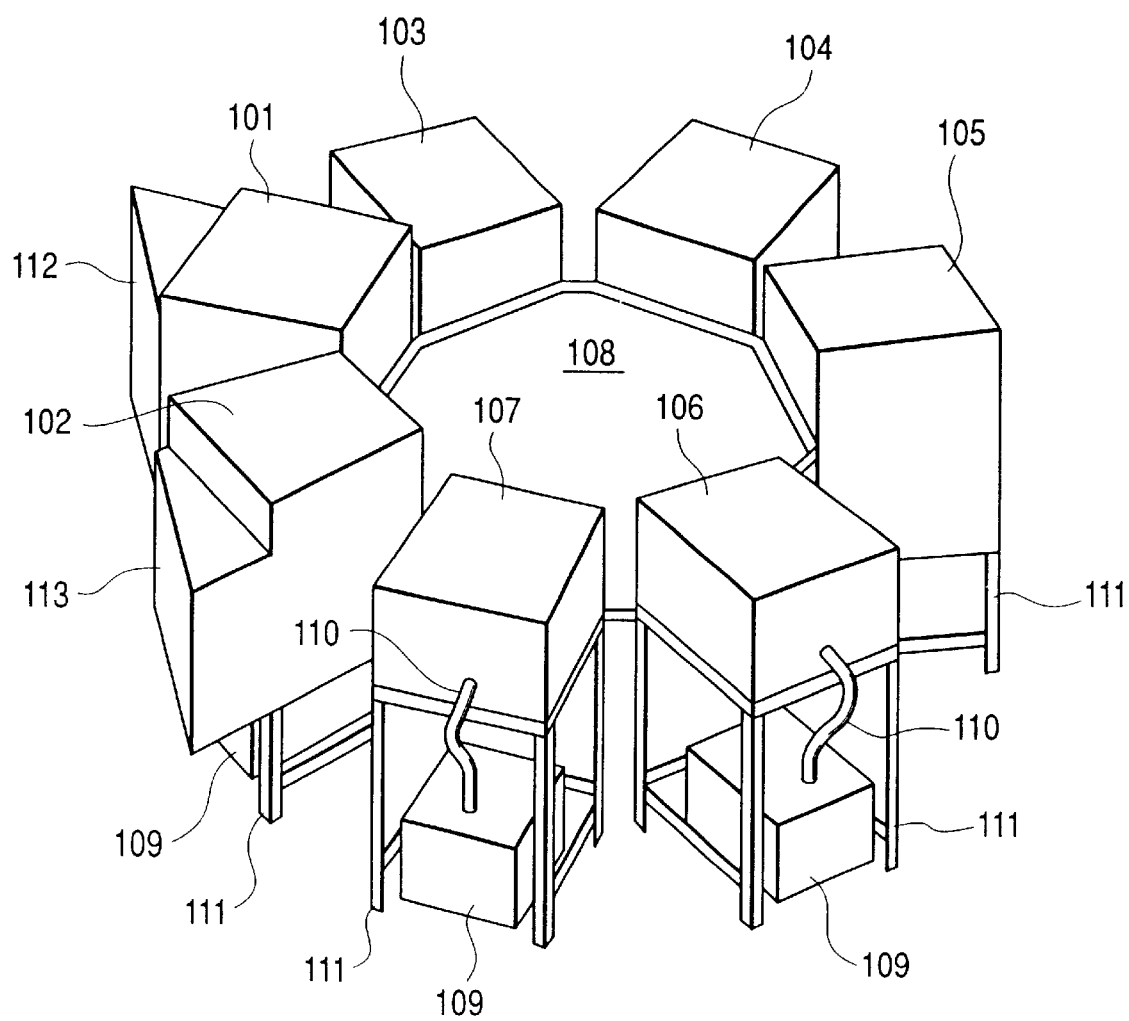
FIG. 6 illustrates an example of a nitrogen plasma processing system usable in the present invention.

FIG. 6 is a schematic perspective view showing a sheet-by-sheet type multi-chamber system having a nitrogen plasma processing system used in the present invention and a CVD system for forming conductors. Part of the structure shown in FIG. 3 can also be produced using this system.

In FIG. 6, reference numerals 101 and 102 denote load lock chambers for holding the substrates to be processed; 103, 104, 106 and 107, reaction chambers; 105, a heating chamber; and 108, a transport chamber internally having a substrate transport means, which is omitted from illustration in the drawing. Each chamber is placed on a supporting stand 111.

The above chambers respectively communicate with vacuum pumps 109 through exhaust pipes 110 so that the chamber insides can be maintained at an appropriate pressure. This system is called a cluster type, and has the reaction chambers 103, 104, 106 and 107, at least one of which, however, may not be used depending on a fabrication process. In such an instance, it is also possible to detach the reaction chamber(s) not on use.

In the following fabrication process for the semiconductor device of the present invention, the reaction chamber 107 is set unused.

According to this system, the nitriding and plug formation can be continuously carried out without exposing substrates to the atmosphere, and hence structures can be produced in a superior reproducibility.

The system is operated in the following way.

First, the load lock chamber 101 is set to serve as a substrate carrying-in chamber (hereinafter "carrying chamber"). An open-close means 112 is opened, and a substrate on which titanium silicide ($TiSi_2$) has been formed is put into the carrying chamber 101. After its inside is evacuated, a gate valve provided between the carrying chamber 101 and the transport chamber 108 is opened to carry the substrate into the transport chamber 108.

The substrate is put into the heating chamber 105, and the substrate is heated there.

The substrate preheated is transported to the reaction chamber 103, and then the reaction chamber 103 is closed. The pressure inside the reaction chamber is maintained at 13.3 Pa to 133 Pa and the substrate temperature is set at 100° C. to 200° C., where the surface of the substrate, i.e., the surface of $TiSi_2$ is cleaned. Gas used here is a gas obtained by diluting $ClF_3$, and the surface of $TiSi_2$ is cleaned by etching to a depth of about 5 nm to about 10 nm.

The gate valve of the reaction chamber 103 is opened, and the substrate thus cleaned is transported from the reaction chamber 103 to the reaction chamber 104 through the transport chamber 108, where a gate valve of the reaction chamber 104 is closed. Nitrogen plasma processing is carried out in the reaction chamber 104. The inside of the reaction chamber 104 is kept evacuated to about 13.3 Pa to about 133 Pa, and the the substrate is kept heated to 200° C. to 450° C. In this reaction chamber, a parallel plate type electrode is used to cause glow-discharge plasma of nitrogen gas to take place. Thus, the titanium silicide at the substrate surface is nitrided to become α-TiSiN. If the pressure is lower than 13.3 Pa or the temperature is lower than 200° C., a poor film quality may result. If on the other hand the temperature is higher than 450° C., the TiSiN tends to become polycrystalline, and if the pressure is higher than 133 Pa, the α-TiSiN film tends to take in impurities.

The gate valve of the reaction chamber 104 is opened, and the substrate is transported from the reaction chamber 104 to the reaction chamber 106 through the transport chamber 108. In the reaction chamber 106, the substrate is maintained at 160° C. to 450° C., and DMAH gas and hydrogen gas are introduced into it to deposit an aluminum metal on the α-TiSiN by CVD.

After the aluminum metal is deposited, the gate valve of the reaction chamber 106 is opened, and the substrate is transported to the transport chamber 108. Then the gate valve of the load lock chamber 102, which serves as a delivery chamber, is opened to collect the substrate in the load lock chamber 102.

Processing conditions in each reaction chamber may be adjusted so that substrates can be processed simultaneously in the reaction chambers 103, 104 and 106. This can make larger the number of substrates to be processed per unit time.

A fabrication process of an example in which the structure shown in FIG. 3 is employed as the source or drain of an MOS transistor will be described with reference to FIGS. 7 and 8.

On the top surface of a silicon substrate 1, a field insulating film 51 is formed by selective oxidation and a gate insulating film 52 is formed. Thereafter, a gate electrode 53 comprised of polysilicon is formed. Subsequently, phosphorus ions are ion-implanted (S1 in FIG. 7). Instead of phosphorus ions, arsenic ions can be used.

Next, heat treatment is carried out to form an $n^-$-type semiconductor layer 55 serving as a source or drain and also to thermally oxidize the surface. The whole substrate surface is subjected to anisotropic etching so that a sidewall region 54 comprised of silicon oxide is left on the sides of the gate electrode 53. Then, phosphorus ions are ion-implanted (S2 in FIG. 7).

Heat treatment is carried out to form an $n^+$-type semiconductor layer 58 serving as a source or drain, and thereafter the oxide film present on the source or drain and gate electrode is removed by etching, followed by sputtering or CVD to deposit a titanium (Ti) film over the whole surface. Thereafter, heat treatment is carried out to cause the Ti on the source or drain and gate electrode to react and combine with the underlying Si to make them into silicide, followed by etching to remove the Ti film having been left without being made into silicide. Thus, titanium silicide layers 56 and 57 remain only on the gate electrode and on the source or drain, respectively (S3 in FIG. 7).

Figure 7:
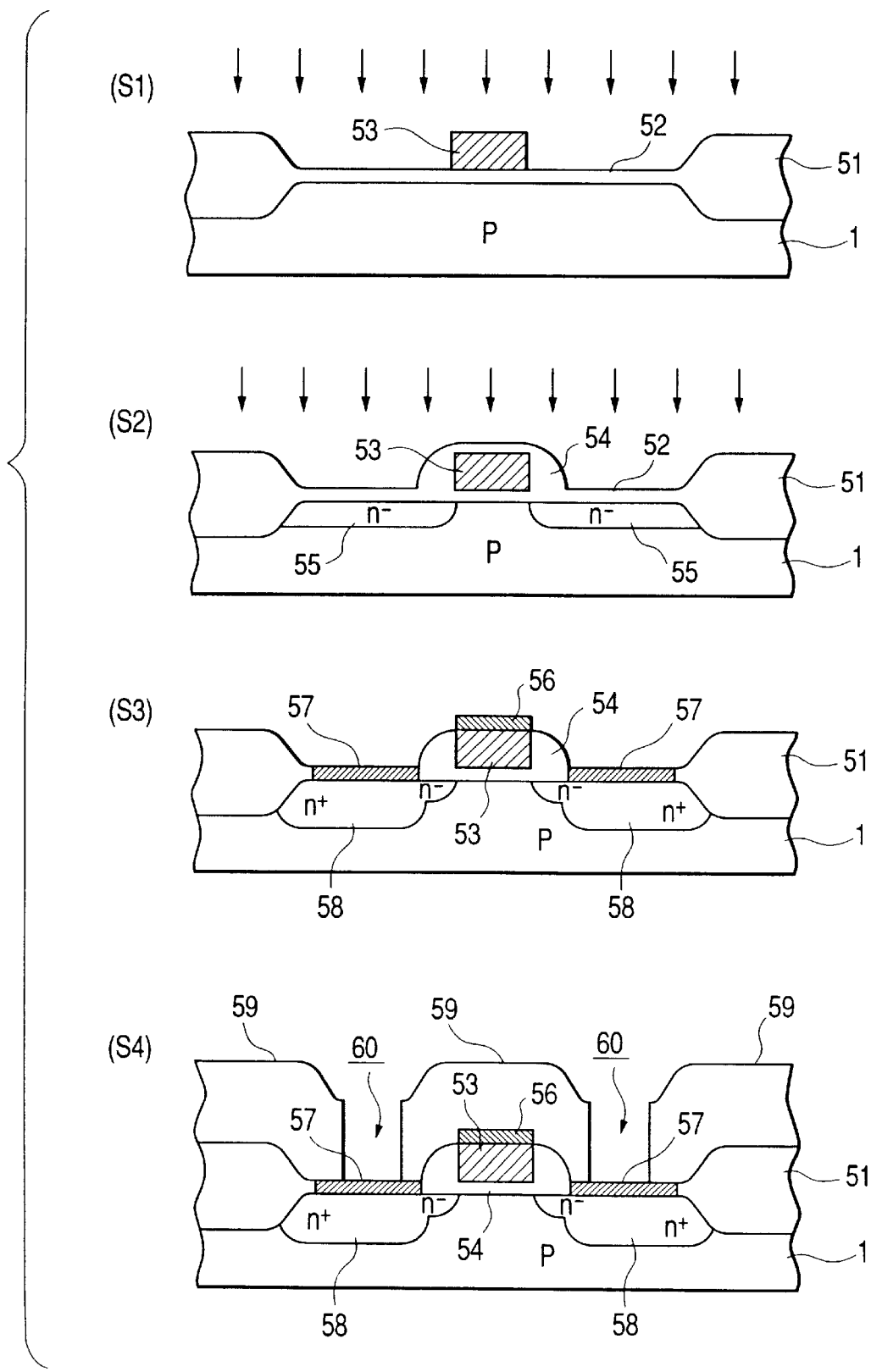
FIG. 7 illustrates a fabrication process of an example in which the structure shown in FIG. 3 is employed in the source or drain of an MOS transistor.

Insulating films 59 are formed by CVD, and contact holes 60 are formed by reactive ion etching (S4 in FIG. 7).

Figure 8:
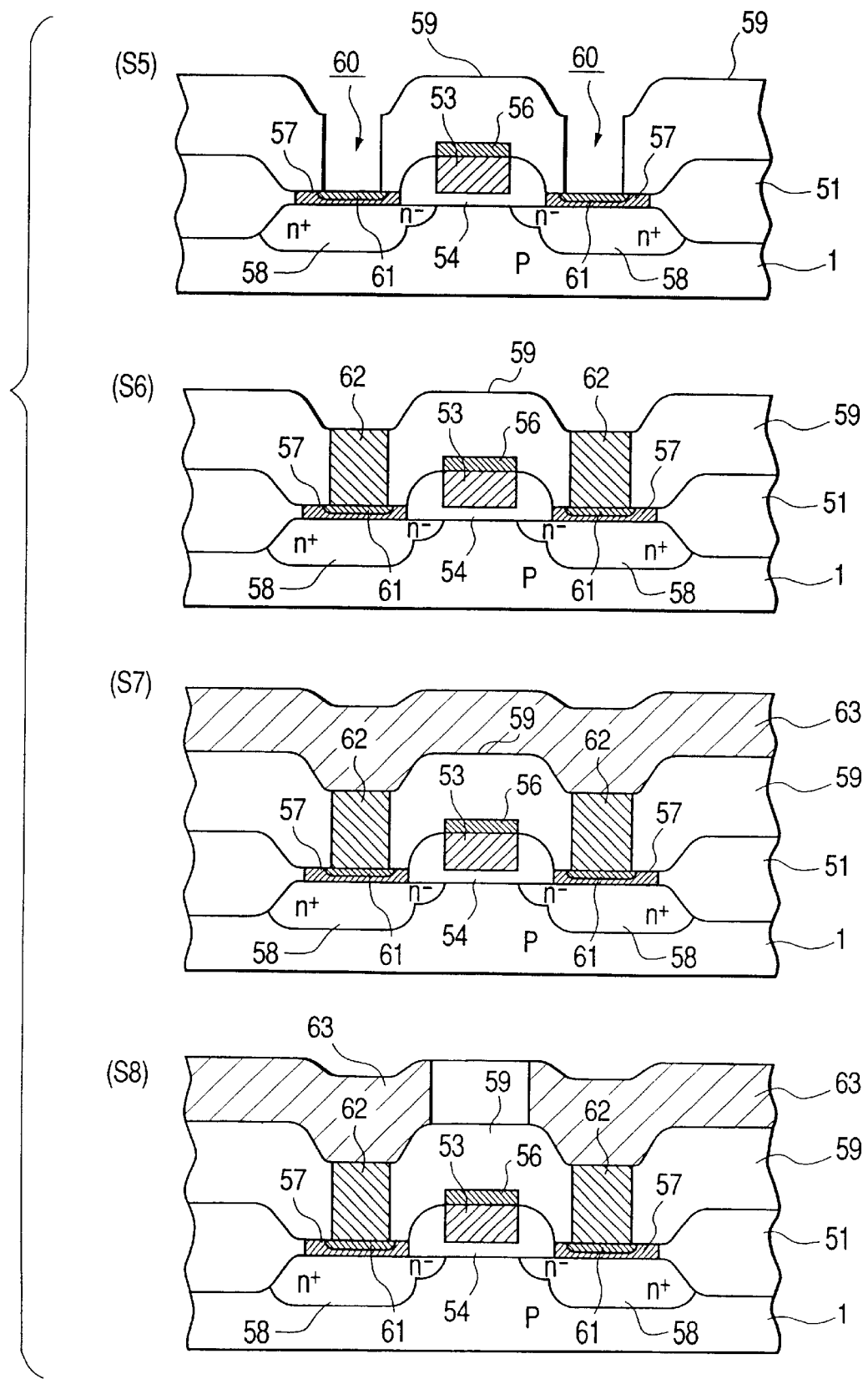
FIG. 8 illustrates a fabrication process of an example in which the structure shown in FIG. 3 is employed in the source or drain of an MOS transistor.

Next, using the sheet-by-sheet type multi-chamber system shown in FIG. 6, steps S5 and S6 shown in FIG. 8 are carried out.

In the same manner as previously described, the substrate is maintained at 400° C. and the pressure is set at 27 Pa, where the surface of the substrate is exposed to $N_2$ plasma. Thus, the titanium silicide layers laid bare at the contact hole are nitrided to produce α-TiSiN films 61 of less than 10 nm thickness (S5 in FIG. 8).

At this stage, the surface of the insulating film 59 of silicon oxide or the like and the sidewall of the contact hole have been doped with nitrogen atoms.

Next, plugs 62 of an aluminum metal are formed in the contact holes by selective CVD making use of DMHA and $H_2$ (S6 in FIG. 8).

Then, the substrate thus processed is taken out of the system shown in FIG. 6. Next, using another system, a conductive film 63 of Al—Si—Cu or the like is formed by sputtering or CVD (S7 in FIG. 8).

Finally, the conductive film 63 is patterned by etching to have the shape of source or drain wiring (S8 in FIG. 8).

Thus, the structure shown in FIG. 3 can be employed as the source or drain of an MOS transistor.

If necessary, additional plugs may further be formed by first forming titanium silicide on the surface of the conductive film 63, then forming an interlayer insulating film, forming contact holes therein (which may also called via holes or through holes), and thereafter forming the α-TiSiN films in the manner as described above.

Thus, without limitation to the contact portions between transistors and metal wiring, the structure of the present invention can also be applied to contact portions between metal wirings each other.

A process for forming titanium silicon nitride (TiSiN) by CVD and the fabrication of a semiconductor device by the use of such a process will be described with reference to FIGS. 9 and 10.

Figure 9:
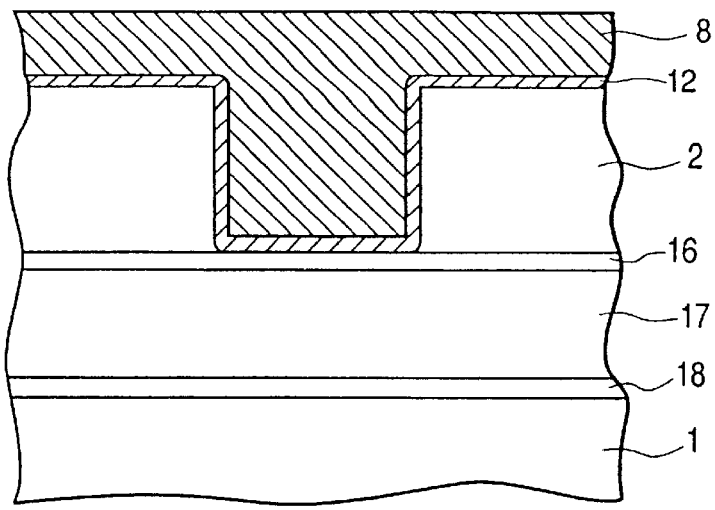
FIG. 9 illustrates another embodiment of the semiconductor device of the present invention.
Figure 10:
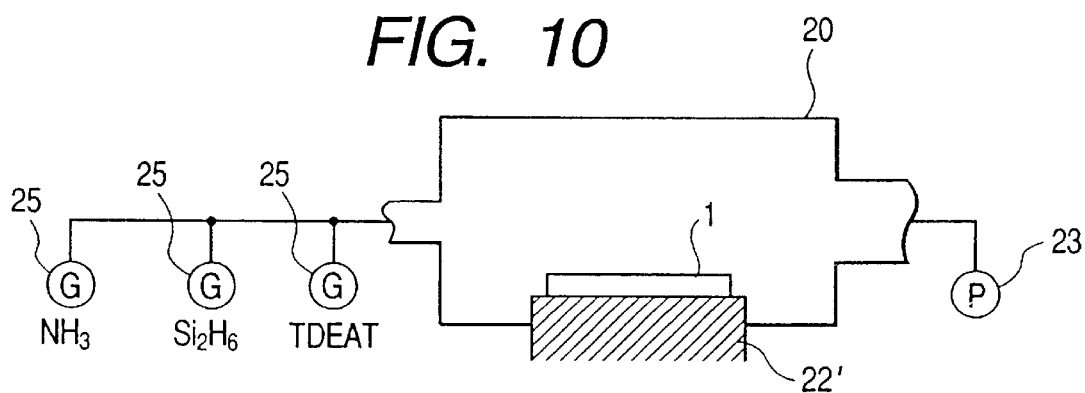
FIG. 10 is a schematic view of a CVD system for forming the $\alpha$-TiSiN film.
Figure 11:
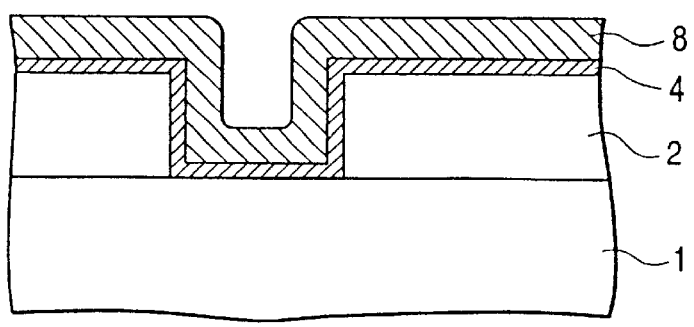
FIG. 11 is a schematic cross-sectional view of an example of a contact hole portion of a conventional semiconductor device.
Figure 12:
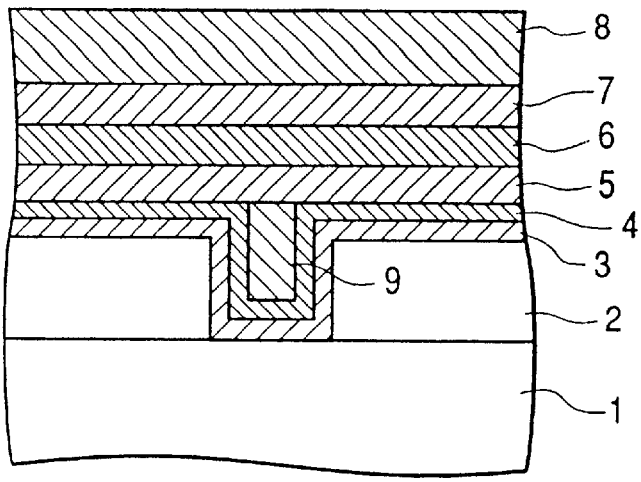
FIG. 12 is a schematic cross-sectional view of another example of a contact hole portion of a conventional semiconductor device.
Figure 13:
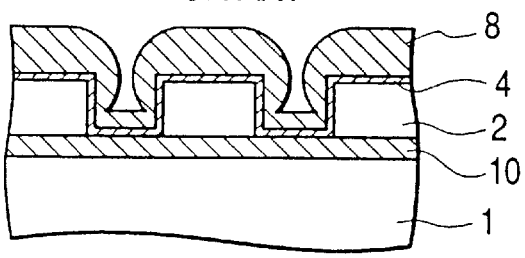
FIG. 13 is a schematic cross-sectional view of still another example of a contact hole portion of a conventional semiconductor device.
Figure 14:
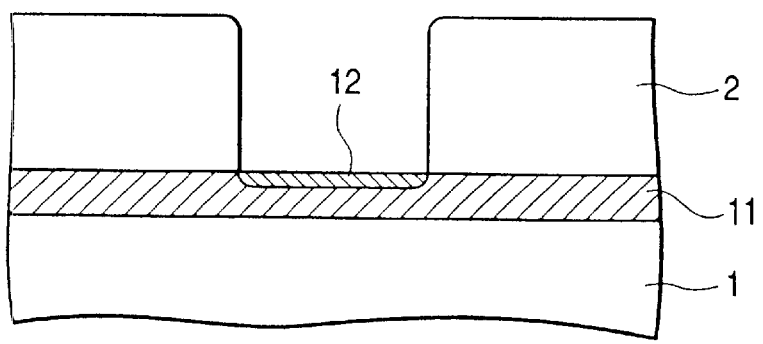
FIG. 14 illustrates a conventional titanium silicon nitride provided on the bottom of a contact hole.

FIG. 9 is a schematic cross-sectional illustration of a semiconductor device produced by this process. In FIG. 9, reference numeral 1 denotes a substrate; and 16 and 18, barrier layers of titanium silicide, which may optionally be provided. Reference numeral 17 denotes a metal film of pure Al, Al—Si, Al—Si—Cu, Al—Cu or Cu; 2, an insulating film of $SiO_2$ or SiN; 12, an amorphous TiSiN film deposited on the sidewall of a through hole made in the insulating film 2, the bottom of the through hole and the top surface of the insulating film 2, and having a thickness of about 10 nm. Reference numeral 8 denotes a metal film like the film 17.

The fabrication of the semiconductor device shown in FIG. 9 will be described below. A system shown in FIG. 10 is used to form the amorphous TiSiN film.

First, the barrier layer 18, the metal layer 17 and the barrier layer 16 are successively formed on the substrate 1 by sputtering or CVD.

Next, the insulating film 2 is formed by CVD making use of an organosilane as exemplified by TEOS (tetraethoxysilane or tetraethyl orthosilicate), followed by coating with a photoresist, exposure of the photoresist to KrF excimer laser light, development of the photoresist and then reactive ion etching to form through holes of 0.25 μm square each. Thereafter, the substrate having the through hole is cleaned with plasma, and then put in a CVD chamber (reaction chamber) 20 without exposure to the atmosphere. The substrate 1 is heated with a heater (not shown) provided in a substrate holder 22'. The inside of the reaction chamber 20 is evacuated by a vacuum pump 23 and is kept at a predetermined pressure. A gate valve 25 is operated to introduce tetradiethylaminotitanium ($Ti[N(C_2H_5)_2]_4$) (TDEAT) and silicon-containing gas such as $Si_2H_6$ into the reaction chamber, where the barrier layer 12 comprised of amorphous titanium silicon nitride (α-TiSiN) is formed in a thickness of about 10 nm by CVD under conditions of a substrate temperature of from 200° C. to 450° C., and preferably from 300° C. to 400° C., and a pressure of from 13.3 Pa to 267 Pa.

The tetradiethylaminotitanium (TDEAT) is an organotitanium compound which is a dark-orange liquid at normal temperature and has a boiling point of 150° C. and a vapor pressure of 13.3 Pa. Upon its reaction with $Si_2H_6$, nitrogen (N) atoms remain to give a film containing N atoms in a relatively smaller quantity than Ti atoms and Si atoms. This TDEAT is vaporized with a vaporizer, and then mixed with disilane ($Si_2H_6$), optionally followed by addition of ammonia ($NH_3$), thus, a TiSiN film can be formed on the surface of the substrate 1 in the reaction chamber 20. This film, though it is thin, exhibits superior barrier properties. Hence, even if deposited on the sidewall of the through hole, the through hole does not have a high resistance.

The substrate temperature was set at 300° C. to 400° C. and the film was grown to a thickness of about 10 nm, so that an amorphous film of α-$Ti_xSi_yN_z$ (x+y+z=1) film was formed as the TiSiN film, which showed good barrier properties.

Next, a conductive layer 8 composed chiefly of Al is deposited by CVD making use of DMAH, and thereafter aluminum is reflowed to provide the shape as shown in FIG. 9.

According to the present embodiment, the thin α-TiSiN film can be formed not only on the bottom of the through hole but also on the sidewall, and hence any voids can be prevented from being caused in the sidewall by migration of aluminum.

Since in the example shown in FIG. 9 the α-TiSiN film is formed also on the sidewall of the contact hole (through hole), the contact hole may have a high contact resistance as the contact hole is made finer, however it can be formed in a thickness of about 10 nm.

Accordingly, before the insulating film 2 is formed, the α-TiSiN film may be deposited on the whole surface of the barrier layer 16, or on the whole surface of the metal layer 17 in place of the barrier layer 16, by CVD making use of the above TDEAT. Thus, a structure can be obtained wherein the α-TiSiN film is present in the state it is laid bare only at the bottom of the contact hole.

Alternatively, it is also preferable to control the conditions for the CVD so that selective CVD where α-TiSiN grows only on the bottom of the contact hole is carried out to form on the bottom of the contact hole a barrier layer comprised of the α-TiSiN film.

The top of a plug protruding at the upper part of the contact hole may preferably be removed by polishing such as CMP (chemical mechanical polishing) so that the tops of the plug and insulating film can be made even so as to be flat-topped.

As described above, according to the present invention, since the amorphous titanium silicon nitride (α-TiSiN) film is formed as a barrier layer, a conductor film of good quality can be formed on the barrier layer. In particular, the barrier layer of the present invention can be a continuous thin film of good quality even when formed in a small thickness of less than 10 nm, and moreover can have a sufficiently low resistivity in its thickness direction.

According to the present invention, since any barrier layer is not present on the sidewall of the contact hole and the plug grown on the barrier layer and having a lower resistance than the resistance of the barrier layer is provided in contact with the sidewall, the contact hole can have a low contact resistance.

Thus, the structure at the contact hole portion can be obtained which is low-resistant, though fine.

What is claimed is:

1. A process for forming amorphous titanium silicon nitride on the surface of a substrate comprising the steps of:

a) forming titanium silicide on the surface of the substrate; and b) exposing the titanium silicide formed on the surface of the substrate, to nitrogen plasma while maintaining the temperature of the substrate within the range of from 200° C. to 450° C. and keeping the inside of a reaction chamber at a pressure of 13.3 Pa or above, to form the amorphous titanium silicon nitride.

2. The process according to claim 1, wherein an insulating film having a contact hole is formed on the titanium silicide after the titanium silicide has been formed, and the amorphous titanium silicon nitride is formed on the surface of the titanium silicide laid bare at the contact hole.

3. The process according to claim 2, which further comprises the step of selectively depositing in the contact hole a conductor different from the titanium silicon nitride.

4. The process according to claim 3, wherein the conductor is formed by chemical vapor deposition making use of an alkyl aluminum hydride as a material gas.

5. The process according to claim 1, wherein before the titanium silicide is exposed to nitrogen plasma, the surface of the titanium silicide is cleaned.

6. A process for producing the semiconductor device according to claim 1, comprising the step of exposing titanium silicide to nitrogen plasma or to a gas of tetradiethylaminotitanium.

7. A process for forming amorphous titanium silicon nitride on the surface of a substrate provided in a reaction chamber, comprising the step of introducing a tetradiethylaminotitanium gas and an $Si_2H_6$ gas into the reaction chamber while maintaining the substrate temperature within the range of from 200° C. to 450° C. and keeping the inside of the reaction chamber at a pressure of from 13.3 Pa to 267 Pa, to form the amorphous titanium silicon nitride on the substrate.

8. The process according to claim 7, wherein the substrate temperature is set within the range of from 300° C. to 400° C.

9. The process according to claim 7, wherein ammonia gas is introduced into the reaction chamber.

10. The process according to claim 7, wherein a metal film containing aluminum is formed after the amorphous titanium silicon nitride has been formed.

* * * * *